(12) United States Patent
Chen et al.

(10) Patent No.: US 10,570,531 B2
(45) Date of Patent: Feb. 25, 2020

(54) TIAL INTERMETALLIC COMPOUND SINGLE CRYSTAL MATERIAL AND PREPARATION METHOD THEREFOR

(71) Applicant: NANJING UNIVERSITY OF SCIENCE AND TECHNOLOGY, Nanjing (CN)

(72) Inventors: Guang Chen, Nanjing (CN); Yingbo Peng, Nanjing (CN); Gong Zheng, Nanjing (CN); Zhixiang Qi, Nanjing (CN); Minzhi Wang, Nanjing (CN); Pei Li, Nanjing (CN)

(73) Assignee: NANJING UNIVERSITY OF SCIENCE AND TECHNOLOGY, Nanjing (CN)

( * ) Notice: Subject to any disclaimer, the term of this patent is extended or adjusted under 35 U.S.C. 154(b) by 288 days.

(21) Appl. No.: 15/517,165

(22) PCT Filed: Oct. 9, 2015

(86) PCT No.: PCT/CN2015/091508
§ 371 (c)(1),
(2) Date: May 12, 2017

(87) PCT Pub. No.: WO2016/055013
PCT Pub. Date: Apr. 14, 2016

(65) Prior Publication Data
US 2017/0268127 A1  Sep. 21, 2017

(30) Foreign Application Priority Data

Oct. 9, 2014  (CN) .......................... 2014 1 0528019
Oct. 9, 2014  (CN) .......................... 2014 1 0529844
May 13, 2015  (CN) .......................... 2015 1 0244611

(51) Int. Cl.
*C22C 1/02*  (2006.01)
*C30B 29/52*  (2006.01)
(Continued)

(52) U.S. Cl.
CPC ................ *C30B 29/52* (2013.01); *C22C 1/02* (2013.01); *C22C 14/00* (2013.01); *C30B 11/001* (2013.01);
(Continued)

(58) Field of Classification Search
None
See application file for complete search history.

(56) References Cited

U.S. PATENT DOCUMENTS 4,461,659 A   7/1984  Harris
6,059,015 A * 5/2000  Bewlay ................. F27B 14/063
                                              164/122.1
(Continued)

FOREIGN PATENT DOCUMENTS

CN   200610113325.6   5/2007
CN   201010562550.4   4/2011
(Continued)

OTHER PUBLICATIONS

Liu, G. et al., "Microstructure, microsegregation pattern and the formation of B2 phase in directionally solidifed Ti—46Al—8Nb alloy", Journal of Alloys and Compounds, vol. 541, pp. 275-282, available online Jul. 16, 2012.*

(Continued)

*Primary Examiner* — George Wyszomierski
(74) *Attorney, Agent, or Firm* — Flener IP & Business Law; Zareefa B. Flener (57) ABSTRACT

A TiAl intermetallic compound single crystal material and a preparation method therefor are disclosed. The alloy com-
(Continued)

position of the material comprises $Ti_aAl_bNb_c(C, Si)_d$, wherein 43≤b≤49, 2≤c≤10, a+b+c=100, and 0≤d≤1 (at. %).

6 Claims, 7 Drawing Sheets

(51) Int. Cl.
   *C30B 13/00* (2006.01)
   *C22C 14/00* (2006.01)
   *C30B 11/00* (2006.01)
   *C30B 33/02* (2006.01)
   *C30B 35/00* (2006.01)

(52) U.S. Cl.
   CPC .......... *C30B 11/002* (2013.01); *C30B 13/00* (2013.01); *C30B 33/02* (2013.01); *C30B 35/007* (2013.01)

(56) References Cited

U.S. PATENT DOCUMENTS

| | | | | |
|---|---|---|---|---|
| 2004/0040690 | A1* | 3/2004 | Ray | B22D 13/00 164/529 |
| 2004/0105483 | A1* | 6/2004 | Lian | F27B 14/04 373/140 |
| 2004/0231822 | A1* | 11/2004 | Frasier | B22D 47/00 164/122.2 |
| 2012/0152483 | A1* | 6/2012 | Feng | B22D 27/045 164/122.2 |

FOREIGN PATENT DOCUMENTS

| | | |
|---|---|---|
| CN | 201210430950.9 | 2/2013 |
| CN | 201410529844.5 | 1/2015 |
| CN | 20141528019.3 | 2/2015 |
| CN | 20151244611.5 | 9/2015 |

OTHER PUBLICATIONS

English translation of CN 102921929 (published Feb. 2013) obtained from Espacenet.*

International Search Report, dated Jan. 13, 2016, in PCT/CN2015/091508.

Pergamon, Directional Solidification and Microstructural Control of the TiAl/Ti3Al Lamellar Microstructure in TiAl—Si Alloys, D. R. Johnson, H. Inui and M. Yamaguchi, Received Jun. 16, 1995, 0956-7151(95)00338-X.

Pergamon, Alignment of the TiAl/Ti3Al Lamellar Microstructure in TiAl Alloys by Growth From a Seed Material, D. R. Johnson, Y. Masuda, H. Inui and M. Yamaguchi, Received Jun. 21, 1996, PII: S1359-6454(96)00335-7.

Elsevier, Microstructure Control of TiAl Alloys Containing Beta Stabilizers by Directional Solidification, I.S. Jung, H.S. Jang, M.H. Oh, J.H. Lee, D.M. Wee, Materials Science Engineering A329-331 (2002) 13-18.

Elsevier, Directional Solidification of TiAl—Re—Si Alloys With Aligned Gamma/Alpha2 Lamellar Microstructures, T. Yamanaka, D.R. Johnson, H. Inui, M. Yamaguchi, Received Jun. 23, 1998, Intermetallics 7 (1999) 779-784.

Pergamon, Microstructural Control of TiAl—Mo—B Alloys by Directional Solidification, D. R. Johnson, K. Chihara, H. Inui and M. Yamaguchi, Received Jul. 6, 1998, PII: S1359-645498003103.

Pergamon, Microstructural Control Through Seeding and Directional Solidification of TiAl Alloys Containing Mo and C, H. N. Lee, D. R. Johnson, H. Inui, M. H. Oh, D. M. Wee and M. Yamaguchi, Received Oct. 13, 1999, ACTA Mater. 48 (2000) 3221-3233.

Microstructure and Properties of High-Nb Containing TiAl-Base Alloys, G. L. Chen, W.J. Zhang, Z. C. Liu, and S. J. Li, State Key Laboratory for Advanced Metals and Materials, Gamma Titanium Aluminides 1999.

Characterization of Ti—48Al—2Cr Sheet Material, H. Clemens, I. Rumberg, P. Schretter & S. Schwantes, Received Sep. 22, 1993, Intermetallics 2 (1994) 179-184.

Ti Application of Cast Gamma Alloy for Turbochargers, SO Structural Intermetallics 1997, AU Tetsui, T, AF Tetsui, T, BE Nathal, MV, Darolia, R, Liu, CT, Martin, PL, Miracle, DB, Wagner, R, Yamaguchi, M.

Elsevier, Effects of Microstructure on the Deformation and Fracture of Gamma-TiAl Alloys, Young-Won Kim, UES, Materials Research Division, Materials Science and Engineering A192/193 (1995) 519-533.

Elsevier, Effects of Nb and Al on the Microstructures and Mechanical Properties of High Nb Containing TiAl Base Alloys, Z.C. Liu, J.P. Lin, S.J. Li, G.L. Chen, Accepted Feb. 15, 2002, Intermetallics 10 (2002) 653-659.

* cited by examiner

TIAL INTERMETALLIC COMPOUND SINGLE CRYSTAL MATERIAL AND PREPARATION METHOD THEREFOR

BACKGROUND

Technical Field

The present invention relates to the technical field of lightweight high-strength structural materials, and in particular to a TiAl intermetallic compound single crystal material and a preparation method therefor.

Related Art

TiAl intermetallic compound is a new type of lightweight and high-temperature structural material, having a specific gravity that is less than 50% of that of a nickel-based high-temperature alloy, and having high specific strength, high specific stiffness, corrosion resistance, wear resistance, high temperature resistance, and high elastic modulus, as well as excellent oxidation resistance, creep resistance and good high-temperature strength and so on. The temperature during use can be up to 750-900° C., which is close to a Ni-based high-temperature alloy, but the density is only half of the high-temperature alloy. Therefore, the TiAl intermetallic compound is an ideal material for replacement of the Ni-based high temperature alloy, can be widely used in high-temperature components of car or aeroengines such as blades, turbine discs and exhaust valves. For example, the TiAl alloys are high-temperature materials for aerospace applications in a weight reduction unit of gram, especially the best candidate materials for engines. The last two stages of blades of a low pressure turbine in Boeing 787 aircraft are successfully developed by GE with the Ti-48Al-2Cr-2Nb (4822) alloy, to permit the aircraft to have a weight reduction of about 200 Kg. The high Nb TiAl alloy is obviously advantageous over ordinary TiAl alloys in terms of the high-temperature mechanical properties, creep resistance and oxidation resistance, and has an operating temperature increased by about 60-100° C., thus being a TiAl alloy having the most promising prospect in engineering applications.

However, due to the intrinsic brittleness of intermetallic compounds, the poor brittleness of the TiAl alloy at room temperature is a main factor that hinders its industrial application. Moreover, the working temperature of the 4822 alloy used at present is only 650° C., and the high-temperature performance needs to be further improved. Therefore, a large number of studies focus on regulating the microstructure of the TiAl alloy to improve the brittleness at room temperature and improve the working temperature. Due to the apparent anisotropy of the strength and plasticity of the PST crystal of TiAl alloy, a PST crystal with fully lamellar structure is fabricated with the Ti—Al alloy by directional solidification, in which the lamellar structure is oriented parallel to the growth direction of the crystal in the directional solidification, thereby improving the mechanical properties of the TiAl alloy.

The mechanical performance of a TiAl alloy with fully lamellar structure is closely related to its lamellar orientation. By studying the polysynthetic twinned crystal (PST) with a single orientation, it is found that the strength and plasticity are obviously anisotropic. Due to this anisotropy of the fully lamellar structure, it is more adaptable to the service conditions for blades in aircraft engines such as those requiring high temperatures and is amenable only to one-dimensional load. It is undoubtedly extremely advantageous if the TiAl alloy can be made by directional solidification into an engine blade with fully lamellar structure and the lamellar structure is oriented parallel to the axial direction of the blade (the direction of crystal growth in directional solidification). Yamaguchi et al. systematically studied the effect of the lamellar orientation of TiAl alloy on the mechanical properties. It was found that the combination of the yield strength and elongation was optimal, when the loading direction was parallel to the lamellar orientation. Therefore, to further improve the performance of the TiAl alloy in use, it is necessary to control the lamellar orientation of the final structure, so as to obtain a fully lamellar structure of a TiAl intermetallic compound single crystal having an orientation that is in agreement with the load direction.

At present, the methods for controlling the lamellar orientation of the TiAl alloy at home and abroad mainly include seeded method and non-seeded method to change the solidification path. A single crystal PST in which the lamellar orientation is completely parallel to the growth direction is obtained by Yamaguchi and Johnson et al through the seeded method of α-phase solidification using a Ti—Al—Si-based alloy as seed crystal and using necking and crystal selection. The difference between the compositions of the seed crystal and the master alloy usually leads to the uneven composition and performance of the alloy obtained after directional solidification. Moreover, the preparation process of the seed crystal is complex. Therefore, the seeded method has obvious shortcomings.

No fully lamellar TiAl single crystal structures with a lamellar orientation parallel to the growth direction are developed currently by using the non-seeded method at home and abroad. A fully lamellar single crystal structure with a lamellar orientation parallel to the growth direction is obtained from the Ti-46Al-5Nb alloy by Lin Junpin et al using "double directional solidification" at a low G/V condition. It is considered that an α phase with a single orientation parallel to the growth direction can be obtained by the peritectic reaction of the β phase with dendritic spacing in the process with a low G/V under appropriate conditions, without the β→α solid/solid phase transition to generate different phases of the alpha variants, thus accomplishing the control of the lamellar orientation. This method requires two times the same process of directional solidification, more than ordinary non-seeding method more than a solidification process, increasing the crucible material on the alloy pollution, the directional solidification of TiAl alloy industrialization. This method requires two identical directional solidification processes, which is one solidification process more than the ordinary non-seeded method, thus increasing the pollution of the alloy with the crucible material, and being adverse to the industrialization of the TiAl alloys obtained by directional solidification.

Previous studies on the control of lamellar orientation through non-seeded methods at home and abroad are to change the solidification path, which fails to control the lamellar orientation of a single crystal and fails to obtain a single crystal with a lamellar structure that is completely parallel to the growth direction. In order to solve this technical problem, the directional solid phase transition process of the TiAl alloy becomes key to control the lamellar orientation. It can be seen from the phase diagram that after solidification, the TiAl alloy with fully lamellar structure undergoes the solid phase transitions of β→α and α→α$_2$+γ. When the primary phase is a β phase, the preferential growth direction is <001>, and the phase relation is $\{110\}_\beta$//$\{0001\}_\alpha$//$\{111\}_\gamma$[25]. 4 out of 12 variables for $\{110\}_\beta$ are parallel to the growth direction, 8 is inclined at 45° with respect to the growth direction[16,26], and after the solid phase transition, only ⅓ of the habit plane in the lamellar structure formed has an orientation that is parallel to the growth direction. It is clear that the final orientation of the lamellar structure of the TiAl alloy depends not only on the growth direction of the primary β phase but also on the subsequent solid phase transition process. Therefore, the β→α solid phase transition process is also key to control the lamellar orientation. So far, the studies on the control of the lamellar orientation of TiAl are focused on the solidification process; however, the solid phase transition process after solidification is ignored.

Therefore, it is necessary to control the solidification process so that the primary phase upon directional solidification is a β phase, and the nucleation and growth of a new phase and the directional phase boundary migration in the directional solid phase transition of the TiAl alloy also need to be controlled, such that only a lamellar orientation that is 0° with respect to the growth direction is retained during the directional solid phase transition, thereby accomplishing the control of the lamellar orientation of the TiAl alloy during the continuous directional liquid/solid-solid/solid phase transition.

SUMMARY

An object of the present invention is to provide a TiAl intermetallic compound single crystal material having a completely controllable lamellar orientation and excellent room-temperature and high-temperature performances. The material has a desirable lamellar orientation, a uniform and pollution-free structure, a tensile ductility at room temperature of 6.9% while a high strength (729 MPa) is incubated, a yield strength at 900° C. of 637 MPa, and a ductile-brittle transition temperature of 900 or higher.

Another object of the present invention is to provide a method for preparing a TiAl intermetallic compound single crystal material. The objects of the present invention can be accomplished through the following measures.

A TiAl intermetallic compound single crystal material comprises based on atomic percent, an alloy composition of formula: $Ti_aAl_bNb_c(C, Si)_d$, where $43 \leq b \leq 49$, $2 \leq c \leq 10$, $a+b+c=100$, and $0 \leq d \leq 1$.

In an embodiment, the material comprises an alloy composition of formula $Ti_aAl_bNb_c(C, Si)_d$, where $42 \leq a \leq 55$, $43 \leq b \leq 49$, $2 \leq c \leq 9$, and $d=0$.

In another embodiment, the material comprises an alloy composition of formula $Ti_aAl_bNb_c(C, Si)_d$, where $44 \leq a \leq 51$, $43 \leq b \leq 47$, $6 \leq c \leq 9$, and $d=0$.

In another embodiment, the material comprises an alloy composition of formula $Ti_aAl_bNb_c(C, Si)_d$, where $43 \leq b \leq 47$, $6 \leq c \leq 10$, $a+b+c=100$, and $0.1 \leq d \leq 1$.

The TiAl intermetallic compound single crystal material of the present invention can be prepared through a non-seeded optical floating zone method of directional solidification comprising the steps of:

(1) mixing pure raw materials with a purity of 99.9% or higher of each substance, in proportions according to the formula of the alloy composition, and melting the materials into master alloy ingots in a cold crucible electromagnetic induction levitation melting furnace at a vacuum level of $10^{-3}$ Pa or lower, followed by a gravity casting process or a suction casting process, to obtain master alloy rods;

(2) cutting the master alloy rods into upper rods and lower rods which are used as raw material rods and seed crystal rods respectively in an optical floating zone directional solidification furnace; controlling the distance between the upper raw material rods and the lower seed crystal rods to 1-5 mm; arranging the raw material rods and the seed crystal rods coaxially and to be perpendicular to the horizontal plane, feeding an inert gas for protection during directional solidification, rotating the upper and lower rods in opposite directions at a relative rotational speed of 10-40 rpm, starting heating to melt the opposite ends of the upper and lower rods, adjusting the positions of the upper and lower rods to allow the opposite ends to gradually approach and be joined to each other, adjusting the power of the equipment and maintaining the temperature for 5-10 min, and then adjusting the growth rate to 2.5-30 mm/h when the surface of the floating zone becomes smooth and the melting is even, so as to start the directional solidification; and after the solidification is completed, reducing the power slowly, and slowly separating the solidified specimens from the remaining feed rod specimens; and (3) subjecting the prepared TiAl alloy single crystal rod to vacuum heat treatment by furnace cooling or air cooling at 1250-1350° C. for 12-24 hrs and then at 900° C. for 30 min.

In a preferred embodiment, in Step (1), a water cooled copper crucible is employed for electromagnetic induction levitation melting, and the master alloy is melted no less than 3 times, and further preferably no less than 4 times.

In a preferred embodiment, in Step (1), the master alloy rods have a size of Φ(4-8) mm×120 mm; differential pressure suction casting is employed in the suction casting process, in which the pressure difference is incubated at 3 MPa; and when the gravity casting process is used, the pressure of the protective gas is two thirds of the standard atmospheric pressure. The size of the prepared round master alloy rod may be Φ (4-8) mm.

In a preferred embodiment, in Step (1), the raw materials of Al, Ti, C or Si have a purity of 99.999% or higher, and the neat metal raw material of Nb has a purity of 99.9% or higher.

In a preferred embodiment, in Step (1), the lower seed crystal rods have a length of 20-30 mm, and the upper raw material rods have a length of less than 190 mm.

In a preferred embodiment, in Step (2), the inert gas is argon or nitrogen, and the inert gas is fed at a flow rate of 3-5 L/min during the directional solidification.

In a preferred embodiment, in Step (2), the positions of the upper and lower rods are adjusted, to allow the opposite ends to gradually approach and be joined to each other, and then the power of the equipment is adjusted for melting with the temperature being incubated. When the total powder of the device is 4.0 KW, the power is adjusted to 55-70% of the total power.

In a preferred embodiment, in Step (3), the singly crystal rods are subjected to a vacuum heat treatment process of "24 hrs at 1250° C.+30 min at 900° C. for+air cooling" for eliminating the segregation.

The present invention further provides another method for preparing a TiAl intermetallic compound single crystal material. The method includes the steps of:

Step 1: mixing pure raw materials with a purity of 99.9% or higher of each substance, in proportions according to the formula of the alloy composition, and melting the materials into master alloy in a cold crucible levitation melting furnace at a vacuum level of $10^{-3}$ Pa or lower, to homogenize the alloy components after 3-4 times of melting, followed by suction casting to obtain rods for directional solidification;

Step 2: subjecting the TiAl alloy rod specimens to directional solidification in a high-purity yttrium oxide coated corundum crucible, evacuating to $5 \times 10^{-3}$ Pa, and then feeding high-purity argon protective gas to the system; and Step 3: adjusting the power of an induction power source to heat the specimens, and maintaining the temperature at 1450-1650 K for 15-30 min, to start the directional solidification, in which the withdrawal rate of directional solidification is controlled to 5-20 μm/s; and after continuous growth to a specimen length of 50 mm, subjecting the specimens after directional solidification to rapid quench, with the solid-liquid interface being retained.

In a preferred embodiment, in Step 1, the rods for directional solidification have a size of Φ (4-6 mm)×100 mm. In a preferred embodiment, in Step 2, the high-purity yttrium oxide coated corundum crucible has a size of Φ (7-9 mm)×100 mm, and the high-purity argon protective gas is fed such that the pressure is 0.04-0.06 MPa.

The principle underlying this method is that the lamellar orientation of the TiAl alloy is controlled by Bridgman directional solidification. By changing the solidification parameters, i.e. the temperature gradient and the growth rate, the primary phase is ensured to be absolutely a β phase, and then a single crystal is obtained by the grain competition and overgrowth during the solidification process. There is a critical temperature in the solidification process that corresponds to a specific withdrawal rate, at which the α phase having a final lamellar orientation that is 45° with respect to the growth direction is eliminated by means of phase boundary migration, such that among the 12α variables obtained in the β→α phase transition, only the α phase having a final lamellar orientation that is parallel to the growth direction is retained, thus achieving the control of the lamellar orientation.

The present invention has the following advantages over the prior art:

(1) By using the method for preparing a TiAl alloy material provided in the present invention, the mechanical properties of the alloy at room temperature can be greatly improved, and particularly the brittleness at room temperature is improved. In the present invention, the high-temperature mechanical properties of the alloy can be effectively improved by adjusting the content of the Nb element and adding a small amount of C and Si reinforcing elements.

(2) By using the non-seeded optical floating zone method of directional solidification, the alloy pollution is prevented, the problems existing in the seeded method of complex process and non-uniform alloy components distributed in the structure are avoided, thus avoiding the problem of alloy pollution caused by the traditional Bridgman directional solidification, and a TiAl—Nb single crystal is obtained quickly. The use of vacuum heat treatment completely eliminates the large amount of brittle B2 phase and Nb rich segregated phase remaining in the structure of the TiAl alloy after directional solidification, so an alloy material with uniform structure and excellent performances at room temperature is obtained, with the coarseness of the lamella being avoided.

(3) In this method, the conventional Bridgman directional solidification may also be used, in which the continuous directional liquid/solid phase transition-directional solid/solid phase transition are controlled by adjusting the solidification parameters to ensure the growth of an absolute β phase, the final lamellar orientation is controlled in the solid phase transition, and a TiAl alloy single crystal structure having a lamellar orientation that is completely parallel to the growth direction is obtained. In the present invention, the shortcomings of non-uniform components and performances existing in the seeded method are avoided, and a single crystal structure with desirable lamellar orientation is obtained during a single directional solidification process, which simplifies the process.

(4) In the preparation of a TiAl alloy single crystal in the present invention, the lamellar orientation of the single crystal can be completely controlled when the solidification parameters fall within a certain range. The present invention provides a theoretical basis for the industrial application of directionally solidified TiAl alloy.

(5) The method has the advantages of simple process, low cost and greatly improved brittleness at room temperature, thus being of universal applicability and popularization value.

BRIEF DESCRIPTION OF THE DRAWINGS

Note: the microstructures in FIGS. 2-7 are grown from right to left.

DETAILED DESCRIPTION

The disclosure of the present invention will be further described below with reference to accompanying drawings and examples. However, the scope of the present invention is not limited to the following examples Referring to accompanying drawings, a TiAl intermetallic compound single crystal with absolutely controllable lamellar orientation is prepared by Bridgman directional solidification method. A specific embodiment is as follows.

Figure 1:
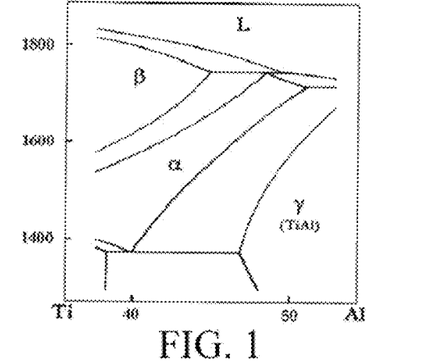
FIG. 1 is a binary phase diagram of a Ti—Al alloy in the prior art.

(1) A Ti—Al—Nb ternary alloy with a primary phase being wholly β phase is used. Based on the phase diagram of a multi-element alloy and the principle of phase selection, the primarily precipitated phase is allowed to be absolutely β phase by adjusting the proportional relation between atomic components, as shown in FIG. 1. Specifically, the content of Nb is increased, and the relative proportion of Al is reduced to form a wide β phase region.

(2) According to the alloy composition obtained in 1), a master alloy is prepared by melting with a high-purity metal component configuration in cold crucible electromagnetic levitation melting equipment under a high-purity Ar gas atmosphere. The master alloy is melted several times to obtain a homogeneous master alloy ingot which is suction casted into master alloy rods.

(3) The TiAl alloy rods are placed in a corundum crucible with high-purity sintered yttrium oxide coating on the inner wall and having a dimension of Φ (5-8 mm)×100 mm, and transferred to a Bridgman directional solidification furnace, and 0.04-0.06 MPa high-purity argon protective gas is filled when the furnace is evacuated to $5 \times 10^{-3}$ Pa.

(4) The specimens are heated by adjusting the power of an induction power source, and incubated at 1450-1650 K for 15-30 min, to start the directional solidification, in which the growth rate upon directional solidification is controlled to 5-20 μm/s.

(5) After continuous growth to a specimen length of 50 mm at a rate, the specimens after directional solidification are subjected to rapid quench, with the solid-liquid interface being retained.

The present invention is further described with reference to specific Examples 1-7 and FIGS. 1-7.

EXAMPLE 1

Figure 2:
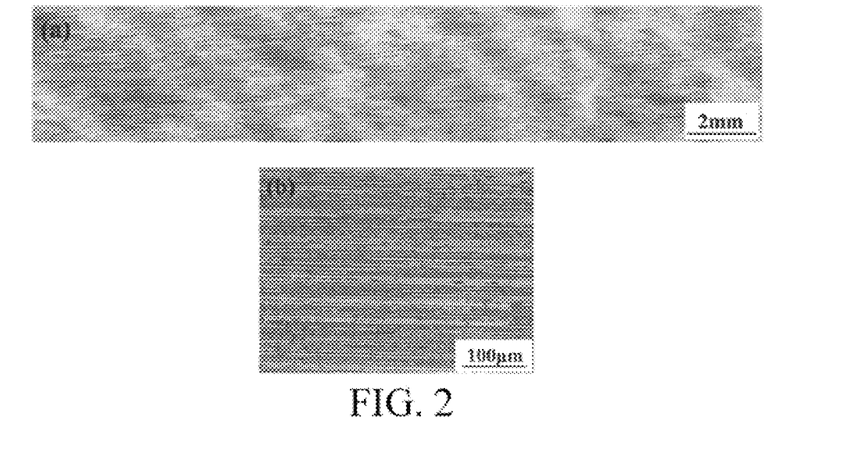
FIG. 2 shows microstructures at a maximum longitudinal section (a) and the lamellar orientation (b) of the specimens of the present invention after directional solidification.

In the experiment, the alloy composition was $Ti_{47}Al_{45}Nb_8$ (atomic percent, at %), in which the purity of the metal components was 99.999%. A master alloy was prepared by melting in a cold crucible electromagnetic levitation melting equipment under a high-purity Ar atmosphere at a vacuum level of $5 \times 10^{-3}$ Pa. A homogenous master alloy ingot is obtained after 4 times of melting, which is suction casted into master alloy rods of Φ4×100 mm. The TiAl alloy rod specimens were placed in a corundum crucible with high-purity yttrium oxide coating on the inner wall for directional solidification. The system was evacuated to $5 \times 10^{-3}$ Pa and then 0.05 MPa high-purity argon protective gas was fed. The specimens were heated by adjusting the power of an induction power source, and incubated at 1550 K for 25 min, to start the directional solidification, in which the growth rate upon directional solidification was controlled to 5 μm/s. When the withdrawn length reached a specimen length of 50 mm, the specimens were subjected to rapid quench, with the solid-liquid interface being retained. The microstructure at a maximum longitudinal section of the cylindrical specimen was characterized, and the primarily precipitated phase, the grain size and the lamellar orientation at this withdrawal rate were observed and analyzed. As shown in FIGS. 2(a) and 2(b), a TiAl alloy single crystal with a lamellar orientation parallel to the growth direction is obtained. When the growth rate is as low as 5 m/s, the enriched solute can be sufficiently diffused and the growth proceeds steadily. The grains have a sufficient time to grow, so that the resulting grains are relatively large until a single crystal is grown.

Figure 3:
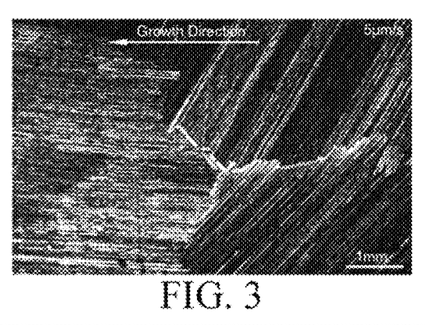
FIG. 3 shows microstructures at a longitudinal section in a competition phase of directional solidification of the specimens of the present invention.

FIG. 3 shows microstructures in a competition phase of directional solidification at 5 μm/s. Because the phase boundary motilities are different due to the different degrees of misfit on the interfaces of 0°- and 45°-slanted lamellas in the β→α solid/solid phase transition, a critical withdrawal rate of 5 μm/s is present, at which after the α grain nucleation at a lamellar orientation of 0° and 45° occurs, the grains slanted at 45° are finally eliminated since the driving force with which the grains grow at 0° is high. A single crystal having a lamellar orientation that is parallel to the growth direction is thus obtained.

EXAMPLE 2

Figure 4:
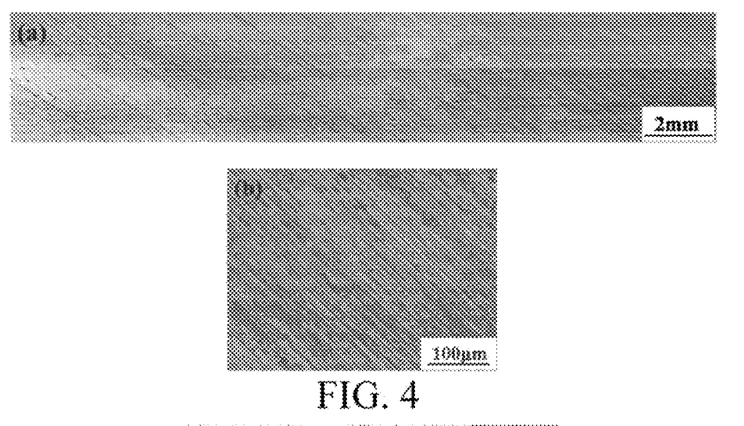
FIG. 4 shows microstructures at a maximum longitudinal section (a) and the lamellar orientation (b) of the specimens of the present invention after directional solidification.

The same alloy composition and method as those in Example 1 were used. The incubation temperature was 1550K and the incubation time was 25 min. The directional solidification was started, during which the growth rate upon directional solidification was controlled to 15 m/s. As shown in FIGS. 4(a) and 4(b), an α phase having a lamellar orientation of 45° is retained at such a withdrawal rate in the β→α solid/solid phase transition, so the final structure is a single crystal having a lamellar orientation of 45°.

Figure 5:
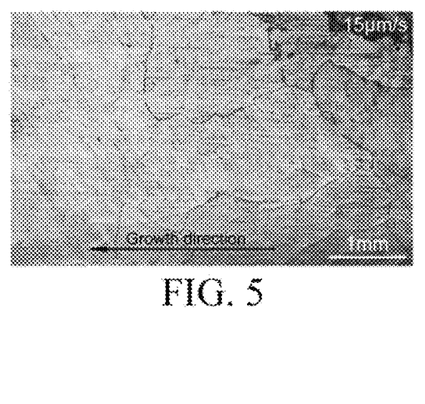
FIG. 5 shows microstructures at a longitudinal section in a competition phase of directional solidification of the specimens of the present invention.

FIG. 5 shows microstructures in a competition phase of directional solidification at 15 μm/s. At such a withdrawal rate, the driving force for grain nucleation at 45° is higher than that at 0° in the solid/solid phase transition, such that the grains slanted at 0° cannot grow, and a TiAl alloy single crystal having a lamellar orientation that is 45° with respect to the growth direction is obtained.

EXAMPLE 3

Figure 6:
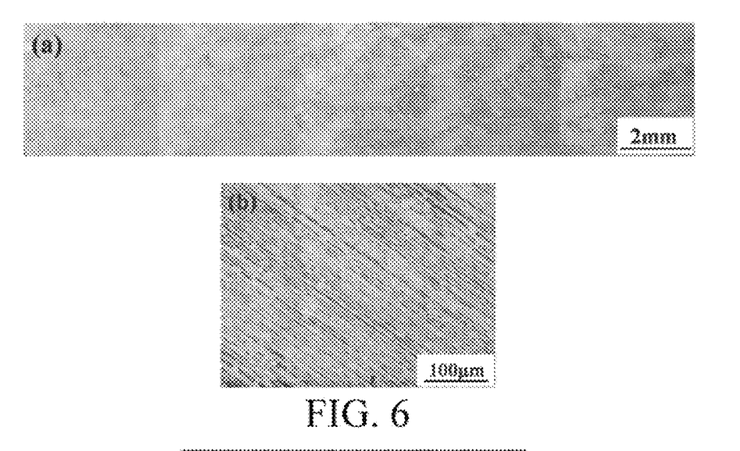
FIG. 6 shows microstructures at a maximum longitudinal section (a) and the lamellar orientation (b) of the specimens of the present invention after directional solidification.

The same alloy composition and method as those in Example 1 were used. The incubation temperature was 1550 K, and the incubation time was 25 min. The directional solidification was started, during which the growth rate upon directional solidification was controlled to 20 μm/s. As shown in FIGS. 6(a) and 6(b), a single crystal having a lamellar orientation that is 45° with respect to the growth direction is obtained.

Figure 7:
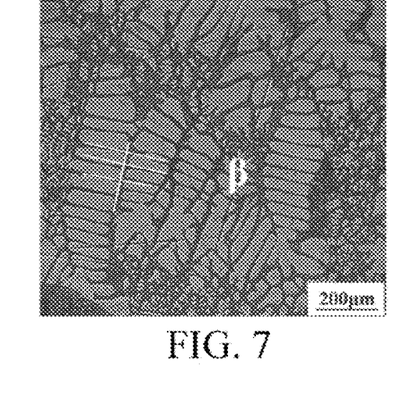
FIG. 7 shows a solid-liquid interface retained after quench of the specimens of the present invention upon directional solidification.

FIG. 7 shows a solid-liquid interface retained after rapid quench. The dendrite growth morphology is quaternarily symmetrical, and has an obvious secondary dendrite that is perpendicular to the primary dendrite. It can be inferred that the β phase of cubic system is the primary phase during the directional solidification.

EXAMPLE 4

The same method as that in Example 1 was used. The alloy composition was $Ti_{55}Al_{43}Nb_2$, the incubation temperature was 1650 K, the incubation time was 30 min, and the growth rate upon directional solidification was 5 μm/s. A TiAl alloy single crystal having a lamellar orientation that is parallel to the growth direction was obtained.

EXAMPLE 5

The same method as that in Example 1 was used. The alloy composition was $Ti_{48}Al_{43}Nb_9$. The incubation temperature was 1450 K, the incubation time was 30 min, and the growth rate upon directional solidification was 10 μm/s.

A TiAl alloy single crystal having a lamellar orientation that is 45° with respect to the growth direction was obtained.

EXAMPLE 6

The same method as that in Example 1 was used. The alloy composition was $Ti_{51}Al_{45}Nb_6$. The incubation temperature was 1650 K, the incubation time was 15 min, and the growth rate upon directional solidification was 5 μm/s. A TiAl alloy single crystal having a lamellar orientation that is parallel to the growth direction was obtained.

EXAMPLE 7

The same method as that in Example 1 was used. The alloy composition was $Ti_{42}Al_{49}Nb_9$. The incubation temperature was 1550 K, the incubation time was 25 min, and the growth rate upon directional solidification was 5 μm/s. A TiAl alloy single crystal having a lamellar orientation that is parallel to the growth direction was obtained.

The present invention is further described in detail in connection with another method for preparing a high-strength and high-plasticity TiAl alloy material with reference to FIG. 8. The specific embodiment is as follows.

Figure 8:
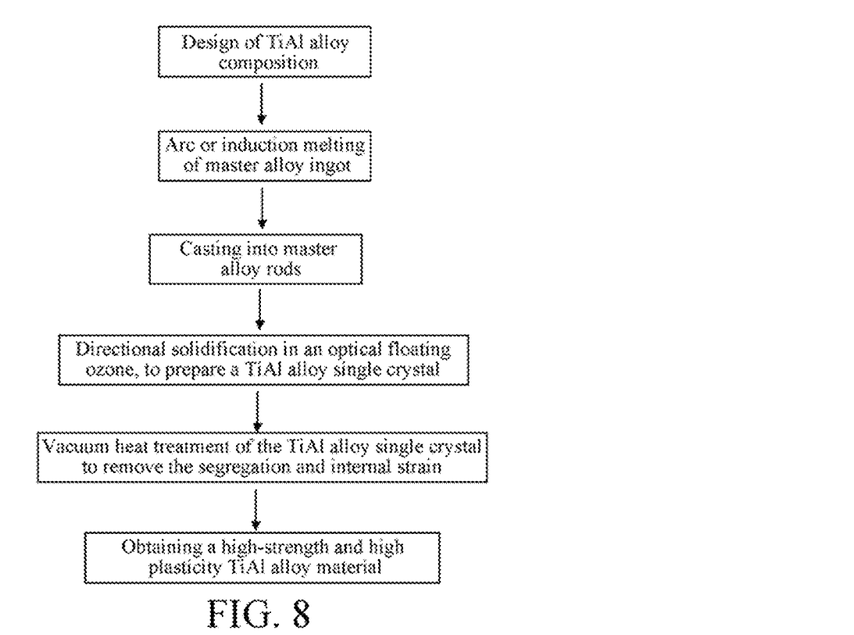
FIG. 8 is a flow chart of a method for preparing a high-strength and high-plasticity TiAl alloy material.

(1) Referring to FIG. 8, the alloy composition based on atomic percent of the high-strength and high-plasticity TiAl alloy material is (44-51)Ti-(43-47)Al-(6-9)Nb. The primarily precipitated phase is allowed to be absolutely β phase by adjusting the proportional relation between atomic components.

(2) A master alloy button ingot of TiAl alloy is prepared by electromagnetic induction levitation melting in a water cooled copper crucible, and then mater alloy rods are obtained after a suction casting process.

(3) The master alloy rods are cut into raw material rods and seed crystal rods which are subjected to directional solidification in an optical floating zone. High-purity argon is introduced and used as a protective gas. The relative rotational speed of the upper and lower sections, the heating power, and the growth rate are adjusted, to control the lamellar orientation of the TiAl alloy and achieve the growth of a single crystal.

(4) The prepared TiAl alloy single crystal rods are subjected to vacuum heat treatment, by heating for a period of time in the α single-phase region, incubating, and then annealing, to completely eliminate the brittle B2 phase and the residual stress, so as to obtain a high-strength and high-plasticity TiAl alloy material.

(5) The microstructure of the prepared TiAl alloy is characterized by OM and XRD, and then the mechanical performances are further characterized, to determine the microstructure of the TiAl alloy with the best comprehensive mechanical performances and corresponding preparation parameters thereof.

The invention will now be further described with reference to specific Examples 8-13 and FIGS. 8-12.

EXAMPLE 8

(1) Choice of Raw Materials:

The alloy composition used in the preparation of master alloy ingots was $Ti_{47}Al_{45}Nb_8$ (atomic percent), in which the purity of the metal component was 99.999% for Ti and Al, and 99.95% for Nb.

(2) Preparation of Master Alloy Ingots:

The master alloy ingots were prepared by melting in a water cooled copper crucible electromagnetic induction levitation melting furnace under a high-purity argon atmosphere. The surface of the metal raw materials was mechanically polished to remove the oxide scale on the surface, and the materials were mixed according to the designed proportion of the components. The mixed material was placed in a water cooled copper crucible in a melting furnace in an amount of about 70 g/ingot, and evacuated to $5 \times 10^{-3}$ Pa. High-purity argon (99.999%) having a pressure ranging from 0.8-1 MPa was fed to the furnace. A homogeneous master alloy ingot was obtained after 3-4 times of melting. Then, the master alloy ingot was suction casted into rods of Φ 6×120 mm.

(3) Directional Solidification in Optical Floating Zone:

The master alloy rods were cut into upper and lower rods, which were used as raw material rods and seed crystal rods respectively in an optical floating zone directional solidification furnace. The lower rods were seed crystal rods of 30 mm in length, and the upper rods were feed rods of less than 100 mm in length. During the directional solidification, the raw material rods and the seed crystal rods were arranged coaxially and to be perpendicular to the horizontal plane. The distance between the upper and lower rods was 5 mm and the interval was at the focusing center of four filaments. High-purity argon protective gas was introduced at a flow rate of 5 L/min. The axial relative rotational speed of the upper and lower rods was adjusted to 30 rpm. Heating was started to melt the opposite ends of the upper and lower rods. The positions of the upper and lower rods were adjusted, to allow the opposite ends to gradually approach and be joined to each other. The power was adjusted to 68% of the total power, and the temperature was maintained for 5 min. When the surface of the floating zone became smooth and the melting was even (that is, no obvious vibration occurred in the floating zone), the growth rate was adjusted to 5 mm/h, to start directional solidification. After growth to 80 mm, the directional solidification was stopped, the power was reduced slowly, and the solidified specimens were slowly separated from the remaining feed rod specimens.

(4) Vacuum Heat Treatment

The TiAl alloy single crystal rod after directional solidification were placed in a corundum tube, evacuated to $10^{-3}$ Pa, and then sealed. The tube was transferred to a heat treatment furnace, and subjected to a heat treatment process comprising furnace cooling at 1300° C. for 24 h and then at 900° C. for 30 min.

(5) Structure and Performance Characterization

Figure 9:
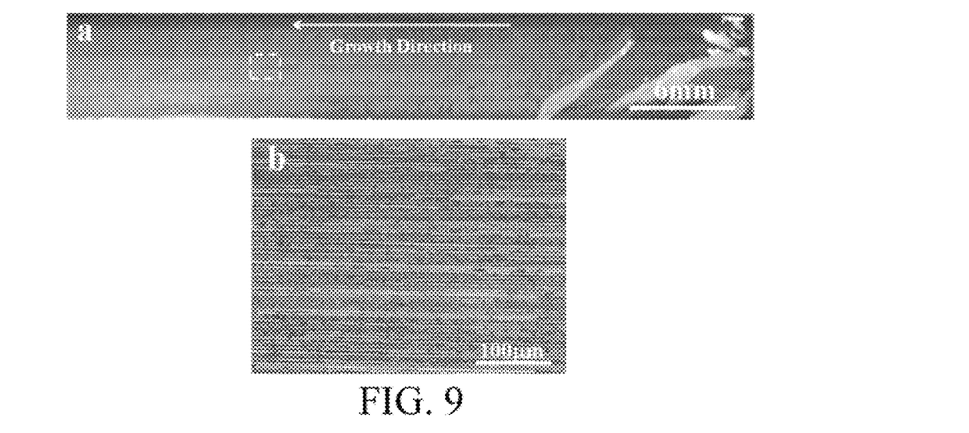
FIG. 9 shows microstructures of a TiAl alloy single crystal (a) and the lamellar orientation (b) after directional solidification.
Figure 10:
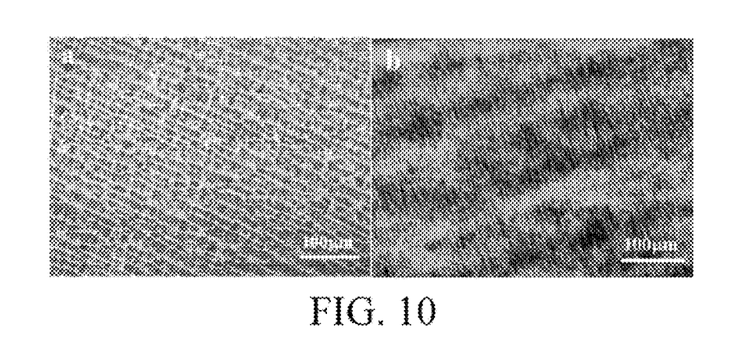
FIG. 10 shows microstructures of segregation in a TiAl alloy single crystal before and after different heat treatment processes (a. before heat treatment, and b. after heat treatment).
Figure 11:
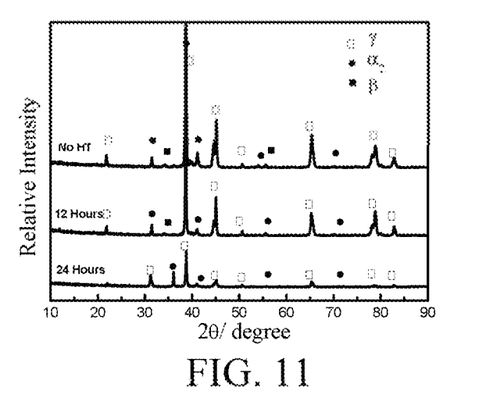
FIG. 11 is an XRD pattern of a TiAl alloy single crystal before and after different heat treatment processes.
Figure 12:
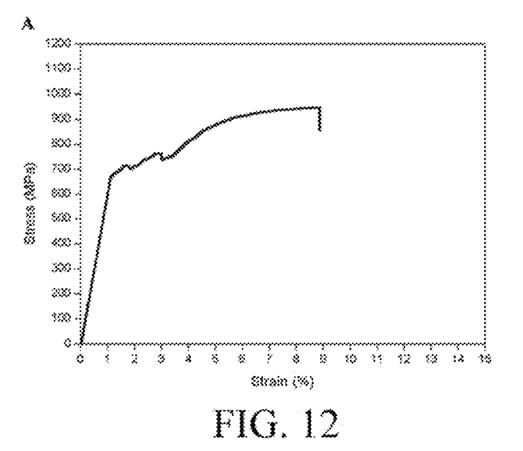
FIG. 12 shows a tensile mechanical property profile at room temperature of a TiAl alloy.

FIG. 9a shows a macroscopic photograph of rod specimens after the directional solidification in an optical floating zone. It can be seen that the specimens is rapidly grown into a single crystal after the short-term competition and elimination in the directional solidification. FIG. 9b shows that the lamellar orientation of the single crystal is parallel to the growth direction. FIGS. 10(a) and 10(b) show the microstructures before and after the heat treatment. In connection with the XRD pattern of FIG. 11, it can be seen that a large amount of B2 phase is distributed in the structure before heat treatment, and the B2 phase is completely eliminated after 24-h heat treatment. FIG. 12 shows a tensile strength-strain curve at room temperature of the high-strength and high-plasticity TiAl alloy prepared. The yield strength is 729 MPa and the plastic strain is 6.9%. Therefore, the alloy has excellent mechanical properties at room temperature.

EXAMPLE 9

The same preparation method as that in Example 8 was used. The alloy composition was $Ti_{44}Al_{47}Nb_9$ (atomic percent). The directional solidification process in the optical floating zone included a relative rotational speed of 20 rpm, a heating power of 55% of the total power, and a growth rate of 2.5 mm/h. The vacuum heat treatment process included furnace cooling at 1250° C. for 12 hrs and then at 900° C. for 30 min. The B2 phase was completely eliminated, to obtain a TiAl alloy material having a yield strength of 550 MPa and a plastic strain of 6.0% at room temperature.

EXAMPLE 10

The same preparation method as that in Example 8 was used. The alloy composition was $Ti_{51}Al_{40}Nb_9$ (atomic percent). The directional solidification process in the optical floating zone included a relative rotational speed of 25 rpm, a heating power of 70% of the total power, and a growth rate of 10 mm/h. The vacuum heat treatment process included furnace cooling at 1300° C. for 20 hrs and then at 900° C. for 30 min. The B2 phase was completely eliminated, to obtain a TiAl alloy material having a yield strength of 628 MPa and a plastic strain of 6.5% at room temperature.

EXAMPLE 11

The same preparation method as that in Example 8 was used. The alloy composition was $Ti_{48}Al_{43}Nb_9$ (atomic percent). The directional solidification process in the optical floating zone included a relative rotational speed of 20 rpm, a heating power of 68% of the total power, and a growth rate of 15 mm/h. The vacuum heat treatment process included furnace cooling at 1350° C. for 24 hrs and then at 900° C. for 30 min. The B2 phase was completely eliminated, to obtain a TiAl alloy material having a yield strength of 660 MPa and a plastic strain of 6.2% at room temperature.

EXAMPLE 12

The same preparation method as that in Example 8 was used. The alloy composition was $Ti_{48}Al_{43}Nb_9$ (atomic percent). The directional solidification process in the optical floating zone included a relative rotational speed of 20 rpm, a heating power of 70% of the total power, and a growth rate of 15 mm/h. The vacuum heat treatment process included furnace cooling at 1350° C. for 12 hrs and then at 900° C. for 30 mi. The B2 phase was completely eliminated, to obtain a TiAl alloy material having a yield strength of 593 MPa and a plastic strain of 6.8% at room temperature.

EXAMPLE 13

The same preparation method as that in Example 8 was used. The alloy composition was $Ti_{48}Al_{46}Nb_6$ (atomic percent). The directional solidification process in the optical floating zone included a relative rotational speed of 30 rpm, a heating power of 60%, and a growth rate of 20 mm/h. The vacuum heat treatment process included furnace cooling at 1250° C. for 12 hrs and then at 900° C. for 30 min. The B2 phase was failed to be removed completely. As shown in the XRD pattern in FIG. 10b, a small amount of B2 phase was remained after 12-h heat treatment. A TiAl alloy material having a yield strength of 656 MPa and a plastic strain of 3.0% at room temperature was obtained.

EXAMPLE 14

The same preparation method as that in Example 8 was used. The alloy composition was $Ti_{44}Al_{45}Nb_8$ (atomic percent). The directional solidification process in the optical floating zone included a relative rotational speed of 25 rpm, a heating power of 55%, and a growth rate of 30 mm/h. A TiAl alloy single crystal with a lamellar orientation that is 45° with respect to the growth direction was obtained. The vacuum heat treatment process included furnace cooling at 1250° C. for 12 hrs and then at 900° C. for 30 min/. The B2 phase was completely eliminated, to obtain a TiAl alloy material having a yield strength of 430 MPa and a plastic strain of 7.8% at room temperature.

EXAMPLE 15

(1) The alloy composition, based on atomic percent, was Ti-45Al-8Nb-0.3C-0.2Si, with the balance being Ti. The starting raw materials included Al, Ti, C and Si with a high purity of 99.999% and Nb with a high purity of 99.95%. The materials were repeatedly melted 4 times in a cold crucible electromagnetic induction levitation melting furnace at a vacuum level of 5×10-3 MPa, to obtain a TiAl—Nb master alloy ingot.

(2) A round rod-like alloy of Φ 6 mm was obtained after a differential suction casting process at a pressure difference of 3 MPa.

Figure 13:
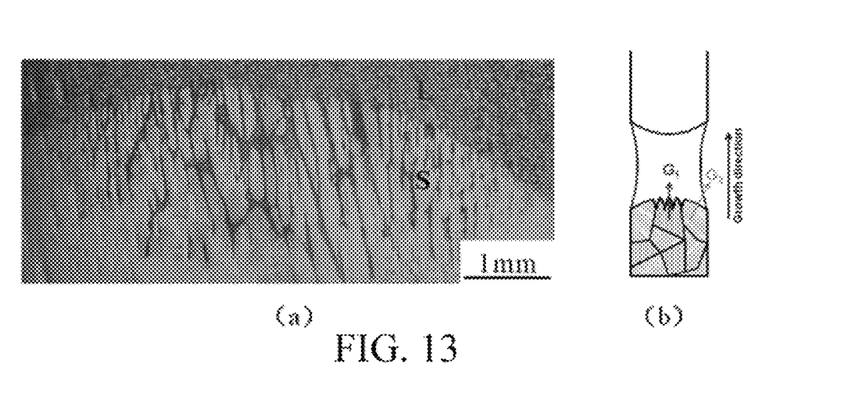
FIG. 13 shows (a) the morphology of a solid-liquid interface upon solidification of a TiAl—Nb single crystal and (b) the principle of necking and crystal selection.
Figure 14:
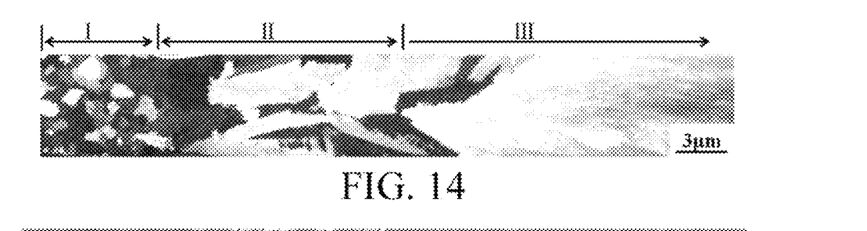
FIG. 14 shows an optical morphology of a TiAl—Nb alloy after directional solidification.

(3) An optical floating zone method of directional solidification was used. The master alloy rods obtained after suction casting were cut into upper feed rods of 150 mm in length and lower seed crystal rods of 20 mm in length. The feed rods were amenable to necking and crystal selection treatment. During the directional solidification, the feed rods and the seed crystal rods were arranged coaxially and to be perpendicular to the horizontal plane. The distance between the feed rods and the seed crystal rods was 1-3 mm, and the opposite ends were located at the focusing center of four filaments. A protective gas was introduced at a flow rate of 4 L/min, and the seed crystal rods and the feed rods were adjusted to rotate at 30 r/min in opposite directions. The heating power was ramped to 68% of the total power in 10 min, to melt the alloy, and the temperature was maintained for 5 min. Then, directional solidification occurred at a growth rate of 15 mm/h. Due to the heating feature in the optical floating zone, the solid-liquid interface was a convex interface shown in FIG. 13(a). As shown in FIG. 13(b), the principle was that the grains in the middle portion grew along the growth direction, and the grains at the two sides grew incline to both sides. Therefore, after the feed rods were subjected to the necking and crystal selection treatment, the grains grown in the middle portion eliminated the grains grown on both sides, and grew rapidly into a single crystal. The process from the competitive growth to the final stable growth is shown in FIG. 14. The power was slowly reduced after the directional solidification, and the solidified specimens were slowly separated from the remaining feed rod specimens.

Figure 15:
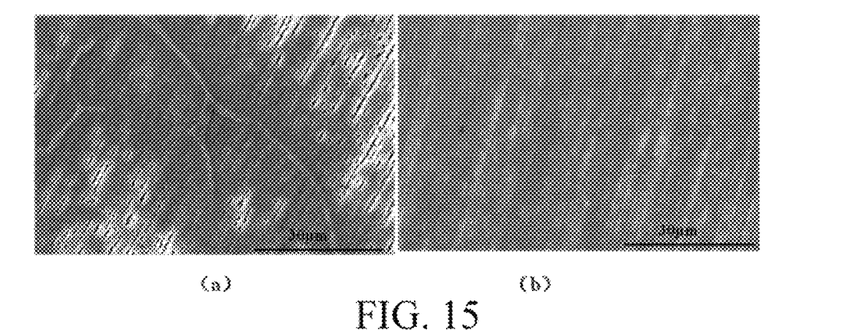
FIG. 15 shows SEM images of segregation in a TiAl—Nb single crystal before heat treatment (a) and after heat treatment (b).
Figure 16:
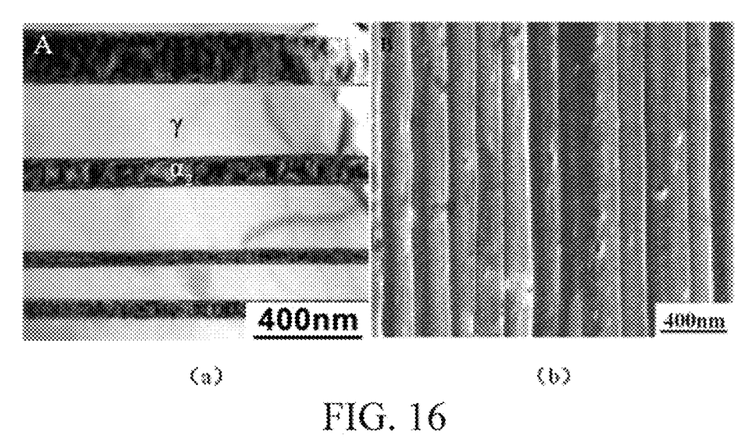
FIG. 16 shows interlamellar distances of a TiAl—Nb single crystal before heat treatment (a) and after heat treatment (b).

(4) The prepared TiAl—Nb single crystal was subjected to vacuum heat treatment for eliminating the segregation. The morphology of segregation before heat treatment was as shown in FIG. 15(a). The segregated phase was eliminated by heating for 24 hrs at 1250° C. in the α single-phase region. After 30-min homogenization at 900° C. and air cooling, the final single crystal was obtained. FIG. 15(b) shows that the segregation is completely eliminated by heat treatment. FIG. 16 shows the variation in interlamella distance before and after heat treatment. Due to the high cooling rate of air cooling, there is no room for coarsening of the lamella.

Figure 17:
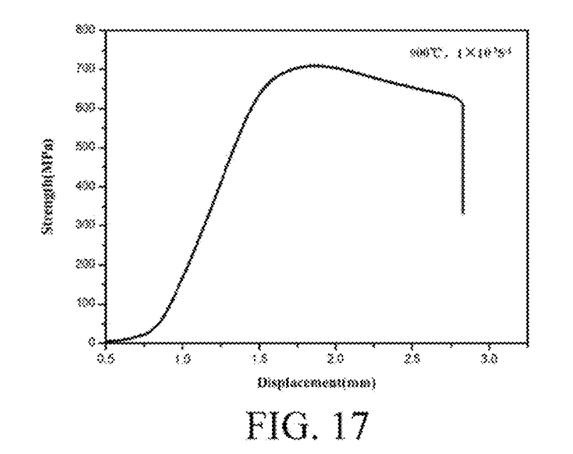
FIG. 17 shows a displacement-strength curve of TiAl—Nb stretched at 900° C.

(5) The single crystal after heat treatment was processed into withdrawn specimens with a nominal size of Φ 3 mm×20 mm. The tensile curve at a tensile rate of 1×10$^{-3}$S-1 and a tensile temperature of 900° C. is as shown in FIG. 17, indicating that the yield strength of the TiAl—Nb single crystal at 900° C. is 637 MPa, the elongation is 8.1%, and the ductile-brittle transition temperature is greater than 900° C., which are far higher than a common TiAl alloy.

EXAMPLE 16

An alloy having a composition of Ti-45Al-8Nb-0.4C-0.5Si (with the balance being Ti) was prepared by using the same method as that in Example 15. However, a gravity casting process was used to obtain round rod-like specimens of Φ 8 mm. Due to the use of necking and crystal selection treatment, single crystal specimens could be obtained rapidly from the alloy of this diameter. After the same heat treatment for eliminating the segregation, the tensile strength is 618 MPa and the elongation is 9.2%.

EXAMPLE 17

The same preparation method as that in Example 15 was used. The alloy composition was Ti-45Al-8Nb-0.4Si-0.6C, with the balance being Ti (based on atomic percent). The same heat treatment process was used. Because the presence of a small amount of C and Si does not change the phase transition temperature greatly, but brings a high temperature strengthening effect, the yield strength of the material at 900° C. becomes 650 MPa, and the plastic strain becomes 7.6%.

EXAMPLE 18

The same preparation method as that in Example 15 was used. The alloy composition was Ti-45Al-8Nb-0.5Si, with the balance being Ti. The withdrawal rate was changed to 40 mm/h. Despite the small temperature gradient, a single crystal was still obtained at a rapid growth rate due to the use of necking and crystal selection treatment. After heat treatment, the yield strength at 900° C. is 595 MPa, and the elongation is 8.7%.

EXAMPLE 19

The same preparation method as that in Example 15 was used. The alloy composition was Ti-43Al-10Nb-0.3C-0.3Si, with the balance being Ti. Although the element Nb brings a reinforcement effect, the segregation is increased correspondingly. The brittle segregated phase can be eliminated by the heat treatment process. The results of tensile test at 900° C. show that the yield strength is up to 668 MPa, and the elongation is 6%.

EXAMPLE 20

The same preparation method as that in Example 15 was used. The alloy composition was Ti-45Al-8Nb-0.4C, with the balance being Ti. The directional solidification process in the optical floating zone was changed and the growth rate was changed to 5 mm/h. A low growth rate was favorable to the formation of a single crystal, as indicated by a shortened distance of an elimination section. After the segregation eliminating vacuum heat treatment, the yield strength of the single crystal alloy material at 900° C. is 602 MPa, and the plastic strain is 7.6%.

EXAMPLE 21

The same preparation method as that in Example 15 was used. The alloy composition was Ti-45Al-8Nb, with the balance being Ti. The directional solidification process in the optical floating zone included a relative rotational speed of 20 rpm. Due to the decreased rotational speed, the temperature becomes more uneven, such that the grains in the middle portion grow rapidly into a single crystal. After stretching at 900° C., the yield strength is 620 MPa, and the plastic strain is 7%.

EXAMPLE 22

The same preparation method as that in Example 15 was used. The alloy composition was Ti-45Al-8Nb-0.4Si-0.6C, with the balance being Ti. The heating power in the optical floating zone was 65% of the total power. Although a low heating temperature leads to a small temperature gradient that is unfavorable for the formation of a single crystal, the necking and crystal selection enables the formation of a single crystal at such a heating power. After stretching at 900° C., the yield strength is 639 MPa, and elongation is 7.2%.

EXAMPLE 23: Application and Performance Comparison

The properties of TiAl single crystal alloys prepared by the optical floating zone method were tested by conventional tensile test at room temperature and high temperature. It is found that the alloys have significantly better properties at room temperature and high temperature than other similar alloys (see table for details).

The brittleness at room temperature of TiAl intermetallic compounds has always been a major problem limiting their application. Generally, the TiAl alloys have an elongation of 2-3% at room temperature. In contrast, the TiAl alloy obtained in the present invention has an elongation of 6.9% at room temperature, while a high strength is maintained (729 MPa). By means of the high plasticity at room temperature, the inherent difficulty in machining the TiAl alloy at room temperature is solved, and the TiAl alloy has a room temperature elongation of 2 to 3% Puzzle, so that the alloy is easy to be machined into a required shape, and its brittleness at room temperature is improved. The performance comparison with some TiAl alloy single crystals is shown in Table 1.

Excellent yield strength at high temperature (900° C./637 MPa): The yield strength at 900° C. of the alloy of the present invention is 637 MPa, which is 30-50% higher than that of other TiAl alloys. It is expected that the alloy can be used at a temperature increased from current 650-700° C. to 900° C. (at present, the Ti-48Al-2Cr-2Nb alloy is successfully used by GE in the 6$^{th}$ and 7$^{th}$-stage blades of a low pressure turbine in Boeing 787 aircraft, at a working temperature of 650° C.). The comparison of performances at 900° C. with other TiAl alloys is shown in Table 2.

Due to the excellent performances at room temperature and high temperature, the TiAl single crystal is expected to have an extended extent of use in the engine blades of Boeing aircrafts and airbuses, to replace the engine blades used at a temperature of 650-900° C., thus bringing a huge benefit in energy saving and emission reduction, and other aspects. In addition, it has important application prospect in the components such as car compressor turbines and exhaust valves, tail skirts of momentum space interceptor engines, nozzles of satellite engines, reversible turbine rotors for aerospace vehicle and so on.

TABLE 1

Comparison of mechanical properties of PST single crystals of TiAl alloy

| Composition (at. %) | Lamellar orientation | Yield strength (MPa) | Elongation (%) |
|---|---|---|---|
| Ti—45Al—8Nb (Example 8) | 0° | 729 | 6.9 |
| Ti—45Al—8Nb (Example 14) | 45° | 430 | 7.8 |
| Ti—43Al—3Si [1] | 0° | 673 | 0.6 |
| Ti—43Al—3Si | 45° | 333 | 2.1 |
| Ti—43Al—3.5Si [1] | 45° | 393 | 1.0 |
| Ti—45.5Al—1.5Si [2] | 0° | 518 | 3.0 |
| Ti—45Al—2Si [2] | 0° | 489 | 1.3 |
| Ti—46Al—1Si [2] | 0° | 419 | 3.3 |
| Ti—47Al—2W [3] | 0° | 350 | 1.4 |
| Ti—47Al—2W | 45° | 275 | 2.0 |
| Ti—43.5Al—3Si—0.5Re [4] | 0° | 522 | 1.7 |
| Ti—46.5Al—1.5Mo—0.6B [5] | 0° | 440 | 2.9 |
| Ti—46.5Al—1.5Mo—0.7B [5] | 0° | 500 | 2.5 |
| Ti—46Al—1.5Mo—0.2C[6] | 0° | 690 | 3.0 |

TABLE 2

Comparison of mechanical properties at elevated temperature (900° C.) of some TiAl alloys with different microstructures, including fully lamellar (FL), nearly fully lamellar (NFL), near gamma (NG), nearly lamellar (NL), degraded fully lamellar (DFL), refined fully lamellar (RFL) and duplex (DP).

| Composition (at. %) | Yield strength (MPa) | Elongation (%) | Strain rate (s-1) |
|---|---|---|---|
| Ti—45Al—8Nb (Example 15) | 637 | 8.1 | $1 \times 10^{-3}$ |
| Ti—48Al—2Cr (DP) [7] | 308 | 78 | $1 \times 10^{-3}$ |
| Ti—48Al—2Cr (DP) [7] | 279 | 81 | $1 \times 10^{-3}$ |
| Ti—47Al—0.7Si—0.4Nb—0.4Cr [8] | (FL) 370 | 38 | |
| Ti—46.5Al—2Cr—3Nb—0.2W [9] | (RFL) 340 | 19 | $0.2 \times 10^{-3}$ |
| Ti—45Al—10Nb (FL) [10] | 562 | 16 | $0.5 \times 10^{-3}$ |
| Ti—45Al—10Nb (NFL) [10] | 460 | 21 | $0.5 \times 10^{-3}$ |
| Ti—45Al—10Nb (NG) [10] | 420 | 23 | $0.5 \times 10^{-3}$ |
| Ti—45Al—8Nb (FL) [11] | 505 | — | $0.5 \times 10^{-3}$ |
| Ti—45Al—8Nb (NL) [11] | 490 | — | $0.5 \times 10^{-3}$ |
| Ti—45Al—8Nb (DFL) [11] | 435 | — | $0.5 \times 10^{-3}$ |

1. D. R. Johnson, H. Inui, M. Yamaguchi, Acta Mater. 44, 2523-2535 (1996).
2. D. R. Johnson, Y. Masuda, H. Inui and M. Yamaguchi, Acta Mater. 45, 2523-2533 (1997).
3. I. S. Jung, H. S. Jang, M. H. Oh, J. H. Lee, D. M. Wee, Mater. Sci. Eng. A 329-331, 13-18 (2002).
4. T. Yamanaka, D. R. Johnson, H. Inui, M. Yamaguchi, Intermetallics 7, 779-784 (1997).
5. D. R. Johnson, K. Chihara, H. Inui, M. Yamaguchi, Acta Mater. 46, 6529-6540 (1998).
6. H. N. Lee, D. R. Johnson, H. Inui, M. H. Oh, D. M. Wee, M. Yamaguchi, Acta Mater. 48, 3221-3233 (2000).
7. G. L. Chen, W. J. Zhang, Z. C. Liu, S. J. Li, Y. W. Kim, Gamma titanium aluminides, 31-40 (1999).
8. H. Clemens, I. Rumberg, P. Schretter. Intermetallics, 2(3), 179-184 (1994).
9. T. Tetsui. Structural Intermetallics, 489-493 (1997).
10. Y. W. Kim. Mater. Sci. Eng. A. 192-193, 519-533 (1995).
11. Z. C. Liu, J. P. Lin, S. J. Li. Intermetallics 10(7), 653-659 (2002).

What is claimed is:

1. A method for preparing a TiAl intermetallic compound single crystal material, the material comprising, based on atomic percent, an alloy composition of formula: $Ti_a Al_b Nb_c (C, Si)_d$, wherein $43 \leq b \leq 49$, $2 \leq c \leq 10$, $a+b+c+d=100$, and $0 \leq d \leq 1$, the method comprising the steps of:
   (1) mixing pure raw materials with a purity of 99.9% or higher of each substance, in proportions according to the formula of the alloy composition, and melting the materials into master alloy ingots in a cold crucible electromagnetic induction levitation melting furnace at a vacuum level of $10^{-3}$ Pa or lower, followed by a gravity casting process or a suction casting process, to obtain master alloy rods;
   (2) cutting the master alloy rods into upper rods and lower rods which are used as raw material rods and seed crystal rods respectively in an optical floating zone directional solidification furnace; controlling the distance between the upper raw material rods and the lower seed crystal rods to 1-5 mm; arranging the raw material rods and the seed crystal rods coaxially and to be perpendicular to the horizontal plane, feeding an inert gas for protection during directional solidification, rotating the upper and lower rods in opposite directions at a relative rotational speed of 10-40 rpm, starting heating to melt the opposite ends of the upper and lower rods, adjusting the positions of the upper and lower rods to allow the opposite ends to gradually approach and be joined to each other, adjusting the heating to maintain a temperature of the upper and lower rods for 5-10 min, and then adjusting a growth rate to 2.5-30 mm/h when the surface of the floating zone becomes smooth and the melting is even, so as to start the directional solidification; and after the solidification is completed, reducing the power, and separating solidified specimens from remaining feed rod specimens; and
   (3) subjecting a prepared TiAl alloy single crystal rod to vacuum heat treatment at 1250-1350° C. for 12-24 hrs and then at 900° C. for 30 min, followed by furnace cooling or air cooling.

2. The method according to claim 1, wherein in Step (1), a water cooled copper crucible is employed for electromagnetic induction levitation melting, and the alloy is melted no less than 3 times.

3. The method according to claim 1, wherein in Step (1), the master alloy rods have a size of Φ (4-8) mm×120 mm; differential pressure suction casting is employed in the suction casting process, in which the pressure difference is incubated at 3MPa; and when the gravity casting process is used, the pressure of a protective gas is two thirds of the standard atmospheric pressure.

4. The method according to claim 1, wherein in Step (1), the raw materials of Al, Ti, C or Si have a purity of 99.999% or higher, and the neat metal raw material of Nb has a purity of 99.9% or higher.

5. The method according to claim 1, wherein in Step (2), the lower seed crystal rods have a length of 20-30 mm, and the upper raw material rods have a length of less than 190 mm.

6. The method according to claim 1, wherein in Step (2), the inert gas is argon or nitrogen, and the inert gas is fed at a flow rate of 3-5 L/min during the directional solidification.

* * * * *